United States Patent [19]

Koontz et al.

[11] Patent Number: 5,271,800
[45] Date of Patent: Dec. 21, 1993

[54] METHOD FOR ANISOTROPIC ETCHING IN THE MANUFACTURE OF SEMICONDUCTOR DEVICES

[75] Inventors: Steven L. Koontz, Seabrook, Tex.; Jon B. Cross, Santa Fe, N. Mex.

[73] Assignee: The United States of America as represented by the Administrator of National Aeronautics and Space Administration, Washington, D.C.

[21] Appl. No.: 729,107

[22] Filed: Jul. 12, 1991

[51] Int. Cl.$^5$ .......................... H01L 21/00
[52] U.S. Cl. .................. 156/643; 156/646; 156/668; 156/662; 250/251; 250/423 R; 250/423 P
[58] Field of Search ............ 156/643, 646, 668, 662; 250/251, 423 R, 423 P

[56] References Cited

U.S. PATENT DOCUMENTS

| | | | |
|---|---|---|---|
| 4,780,608 | 10/1988 | Cross et al. | 250/281 |
| 4,828,817 | 5/1989 | Outlaw | 423/579 |
| 4,961,820 | 10/1990 | Shinagawa et al. | 156/643 |

OTHER PUBLICATIONS

"Atomic Oxygen Beam Source for Orbital Environment Experiment"; Materials & Manufacturing Process; 5(3), 387–396, 1990, Cuthbertson et al.
Visentine, James T., "Atomic Oxygen Effects Measurements for Shuttle Missons STS-8 and 41-G," *NASA Technical Memorandum* 100459 vol. I, pp. 2-1/2 –10, Sep., 1988.
Visentine, James T., "Atomic Oxygen Effects Measurements for Shuttle Missions STS-8 and 41-G," *NASA Techanical Memorandum* 100459 vol. III, Sep., 1988.
Skidmore, J. A. et al. *Journal of Vacuum Science Technology* B6 (6), pp. 1885–1888, Nov./Dec., 1988.
Suzuki et al., *Journal of Vacuum Science Technology* A5 (4), pp. 1605–1606, Jul./Aug.; 1987.
Suzuki et al., *Journal of Applied Physics*, vol. 64 (7), pp. 3697–3705, Oct. 1, 1988.
Hartney, M. A. et al., *Journal of Vacuum Science Technology* B7 (1), pp. 1–13 Jan./Feb., 1989.
Yamada, H. et al., *Journal of Vacuum Science Technology*, B7 (2), pp. 175–180, Mar./Apr., 1989.
Geis, M. W. et al., *Journal of Vacuum Science Technology* A5 (4), pp. 1928–1929, Jul./Aug., 1987.

Primary Examiner—Brian E. Hearn
Assistant Examiner—George Goudereau
Attorney, Agent, or Firm—Hardie R. Barr; Guy M. Miller; Edward K. Fein

[57] ABSTRACT

Hydrocarbon polymer coatings used in microelectronic manufacturing processes are anisotropically etched by atomic oxygen beams (translational energies of 0.2–20 eV, preferably 1–10 eV). Etching with hyperthermal (kinetic energy > 1 eV) oxygen atom species obtains highly anisotropic etching with sharp boundaries between etched and mask-protected areas.

14 Claims, 3 Drawing Sheets

METHOD FOR ANISOTROPIC ETCHING IN THE MANUFACTURE OF SEMICONDUCTOR DEVICES

ORIGIN OF THE INVENTION

The invention described herein was made by employee(s) of the United States Government and may be manufactured and used by or for the Government of the United States for governmental purposes without the payment of any royalties thereon or therefor.

FIELD OF INVENTION

The present invention relates to a new method for anisotropic etching suitable for resist etching and multilayer lithography utilizing hyperthermal atomic oxygen beams.

BACKGROUND OF THE INVENTION

Atomic oxygen (AO) plasmas used in microelectronic manufacture are generally described as glow discharge plasmas. Such low-pressure plasmas range from fractions of millitorr to about 10 torr and are weakly ionized with a typical electron density on the order of $10^{10}/cm^3$. Due to mobility differences, an electrically isolated surface exposed to the plasma develops a negative bias due to the greater mobility of electrons compared to positive ions. The potential difference between these surfaces and the bulk discharge is termed the plasma potential, typically 10 to 30 V. Such plasmas are initiated and sustained by electric fields which are produced by either direct current, (dc) or alternating current (ac) power supplies. Typically, ac frequencies of excitation are 100 kHz at the low end of the spectrum, 13.56 MHz on the radio frequency (rf) portion of the spectrum and 2.45 GHz in the microwave (mw) region. Plasmas may be interchangeably referred to as an electric discharge, gaseous discharge or glow discharge (the latter because they emit light). Plasma reactors available commercially, including flowing afterglow devices, plasma ashers, and the like, generally produce AO having an energy of less than about 0.05 eV.

The use of oxygen plasmas to strip photoresists is a well-known application of plasma etching in microelectronic device fabrication. This technology is an alternative to liquid etching, and is used to remove hydrocarbon resists after they have served their intended masking purpose. Liquid chemical stripping has several disadvantages including, for instance, the need to handle and dispose of large volumes of either hydrocarbon solvents or strongly oxidizing acids.

While resist stripping is a common use for oxygen plasmas, modified plasma discharges also have a role in multilayer lithography. Different plasma conditions, however, are required to etch anisotropically than those normally used in the isotropic resist stripping process: In stripping applications, the primary objective is the rapid removal of resist, without etching or damaging the underlying substrate. This is generally achieved at elevated pressures where the reactant supply is high and ion energy is low. Bilayer pattern transfer, however, requires selectivity between the silicon-containing and hydrocarbon-based materials, with etch anisotropy being the foremost requirement. This process is generally carried out in a reactive ion etching (RIE) mode, characterized by relatively low pressures and high ion bombardment energies. While ion bombardment is needed to increase the degree of etch anisotropy, it is also responsible for secondary damage to the underlying microcircuit.

As semiconductor devices have become increasingly integrated, the damage caused by fabrication processes presents an increasingly serious problem. The primary reason for damage formation is essentially the incidence of energetic particles, such as ions and UV photons, from the plasma to the substrate surface. These particles have energies larger than the damage-formation critical energy. Some ion-induced damage can be treated by removing damaged layers, including techniques such as wet chemical etching, low voltage reactive ion etching or thermal annealing in the presence of reactive gases. However, each additional step decreases the anisotropy of the total process since these removal steps are inherently isotropic in character. In addition, a thermal annealing step, which necessarily takes place after the plasma etching in typical production processes, is not desirable since it changes the boundary shape of doped areas due to thermal diffusion of doping elements. Some effort has been directed to reducing damage caused by energetic ions by decreasing the ion penetration depth by using lower ion energy or heavier ion species. Alternatively, protective coatings on the substrate are used which absorb energetic particles.

An additional serious problem resulting from use of ion enhanced thermal AO processes is that of by-product impurity contamination. Relatively lower volatility reaction products can remain on the substrate as impurities or, plasma related impurities can penetrate the substrate during RIE etching either as a result of direct implantation or diffusion.

Accordingly, it is desirable that a method be developed for anisotropic etching in semiconductor manufacture utilizing oxygen plasmas essentially free of energetic ions and photon particles. Such particles are ordinarily required to achieve an anisotropic etch with atomic oxygen plasmas in the prior art, but cause secondary damage to the underlying substrate. Furthermore, the reaction products should be highly volatile and easily removed from the etched substrate.

Enhanced reactivity of the chemical component at a constant ion energy leads to a higher sputter yield and may reduce material damage. J. A. Skidmore et al. *Journal of Vacuum Science Technology*, pp. 1885-1888, (November/December, 1988) reports that if the chemical etching component is highly reactive and separately controlled from the physical component (ion beams), then very high reactive sputter yields can be obtained for etching GaAs with a degree of anisotropy that can be varied over a wide range by varying the microwave power level and the ion beam current density. This etching technique should be capable of producing smooth, low-damage structures for applications in optoelectronics.

H. Yamadan, et al. *Journal of Vacuum Science Technology*, pp 175-180, (March/April, 1989) discloses the oxygen plasma etching resistance of a plasma polymerized organometallic film deposited on a substrate surface by downstream plasma deposition using gaseous mixtures of an organic monomer ($C_3H_6$) and a tetramethyltin or tetramethylsilane monomer. High oxygen plasma etching resistance was obtained on films containing a few percent metal. It was observed that the metal-oxidized layer was formed on the surface during plasma etching.

M. W. Geis et al., *Journal of Vacuum Science Technology*, pp 1928–1929, (July/August, 1987) and pp 363–365, (January/February, 1987) discloses two dry etching techniques. A first technique utilizes a combined Ar+ beam from an ion source and a directed flux of chemical reactive species from an effusive source and has high aspect ratios for GaAs and other materials. A second technique does not require an ion beam but only uses a directed flux of chemically reactive species that consist primarily of radicals.

Suzuki et al., *Journal of Applied Physics*. pp 3697–3705, (Oct. 1, 1988) discloses anisotropic etching of polycrystalline silicon with a hot $Cl_2$ molecular beam. The etching was said to be almost damage free.

Suzuki et al., *Journal of Vacuum Science Technology*, pp 1605–1606 (July/August, 1987) discloses silicon etching with a hot $SF_6$ beam. The advantages of using a hot molecular beam are said to reside in molecules having stored vibrational energy which is generally much lower than the displacement energy of a silicon crystal. The vibrational energy is lost when a hot molecule reflects off a cold surface. Therefore, an anisotropic etching is expected, and the molecule can supply both reactive material and energy to a surface.

U.S. Pat. No. 4,838,817 to Outlaw discloses a method for producing an atomic oxygen beam where an essentially pure beam of atomic oxygen is produced in a terrestrial laboratory at sufficient flux and energy levels to simulate conditions of low Earth orbit. The method comprises a material which dissociates molecular oxygen and produces atomic oxygen. Heating and excitation releases atomic oxygen into a beam.

U.S. Pat. No. 4,780,608 to Cross et al. discloses a laser sustained discharge apparatus for the production of intense beams of high kinetic energy atomic species. Oxygen atoms having velocities in excess of 3.5 Km/s can be generated for the purpose of studying interaction with materials suitable for spacecraft protection.

SUMMARY OF THE INVENTION

It has been discovered that a sufficiently energetic atomic oxygen plasma, such as a plasma generated by the apparatus of Cross et al., in U.S. Pat. No. 4,780,608, which is hereby incorporated herein by reference, or an atomic oxygen ram flux associated with low Earth orbit (LEO), permits enhanced anisotropic etching in semiconductor manufacture, particularly in photoresist stripping and multilayer lithography applications, with little or no secondary damage to the underlying substrate. Such hyperthermal, i.e. high kinetic energy, oxygen atoms have been found to have thousands of times greater reactivity than thermal oxygen atoms produced by conventional glow discharge devices, such as the plasma asher, sputter-etching apparatus and the like.

In one aspect, the present invention provides a method for anisotropic etching of a hydrocarbon polymer coating in the manufacture of semiconductor wafers. The method includes securing a substrate having at least a portion of a surface having the coating in an atomic oxygen generating device, exposing the surface to a direct beam of hyperthermal atomic oxygen to anisotropically etch the coating, and halting the hyperthermal atomic oxygen impingement after the coating is etched. The atomic oxygen has a kinetic energy which may vary between about 0.2 eV to about 20 eV, preferably between about 1 eV to about 10 eV. The atomic oxygen may be generated by low-flux or high-flux devices having a kinetic energy of at least about 1 eV, such as, for example, atomic oxygen generated by optical laser-induced discharges. Alternatively, the atomic oxygen is generated by dc arc, ac arc, inductive coupling, microwave or electron bombardment discharges.

In another aspect of the present invention, there is provided a method for anisotropic etching of a hydrocarbon polymer coating in the manufacture of semiconductor devices. The method includes securing a substrate having at least a portion of a surface comprising the coating in a chamber having an aperture means, exposing the chamber low Earth orbit environment, introducing atomic oxygen ram flux through the aperture to anisotropically etch the coating, halting the impinging atomic oxygen after the coating is etched and removing the substrate from the chamber.

DETAILED DESCRIPTION OF THE INVENTION

LEO environment comprises in greatest proportion atomic oxygen formed in the ionosphere through dissociation of $O_2$ by vacuum ultraviolet radiation (VUV) of 1000–2000 Å wavelength. Although the composition of Earth's upper atmosphere is not a simple function of altitude, but varies in composition, density, and temperature with (among other things) solar activity, latitude, local time and season, at altitudes between 200 and 700 km, the predominant species is atomic oxygen (AO), and even at altitudes above this, AO remains a significant constituent. Atomic oxygen density in LEO is not particularly high at altitudes of most orbiting vehicles. A number density at about 250 km altitude is $10^9$ atoms/cm$^3$ which corresponds to the density of residual gas in a vacuum of $10^{-7}$ torr. However, due to the high orbital velocity (approximately 8 km/sec at space shuttle altitude), the flux is high, being of the order of $10^{15}$ atoms/cm$^2$-sec. In addition, this high orbital velocity corresponds to collisions with highly energetic (5.3 eV) oxygen atoms. Materials exposed to such energetic AO have been shown to undergo surface erosion and mass loss. In addition, eroded materials exhibit a significantly altered surface morphology with needle like peaks having vertical walls. This morphology is indicative of anisotropic etching of effected surfaces.

Continuing study of the heretofore space-observed phenomenon by replication of such conditions in terrestrial laboratories indicates the anisotropic etching process to be a characteristic of hyperthermal, i.e. energetic $^3P$ ground state atomic oxygen species of $\geq 1$ eV kinetic energy. In addition, anisotropic etching is occurring in an absence of highly reactive species such as high energy ions, metastables such as $^1S$ and $^1D$ oxygen atoms, energetic UV photon, and the like which may damage the underlying substrate.

A mechanism for hyperthermal AO ($\geq 1$ eV) anisotropic etching of hydrocarbon resists is not well known. Etching by lower energy AO, i.e. $\geq 0.05$ eV, has been observed to proceed isotropically, where an isotropic directional etching requires concurrent energetic ion bombardment, as in for example, the mode of etching known as reactive ion etching (RIE). Etch directionality has generally been hypothesized to be the result of directed energy input into an etching reaction at a surface by some ion, electron or photon bombardment of the surface exposed concurrently to a chemical etchant. In RIE processes, this energy input comprises energetic ions and results in etch synergism. It seems likely that once surface oxidation becomes initiated, attack by the etchant is greatly accelerated relative to undamaged surface areas. In the prior art case of RIE, ions overcome initial reaction activation energies. In the present invention where the etchant species is also energetic, the need for activating ions or other species is eliminated.

Figure 1:
FIG. 1 shows a typical Beta cloth area before exposure to the high velocity oxygen atom beam (enlarged 250 times).
Figure 2:
FIG. 2 shows the effects of the high velocity oxygen beam treatment on the Beta cloth (enlarged 220 times).
Figure 3:
FIG. 3 also shows the effect of the high velocity oxygen beam treatment on the Beta cloth and illustrates the anisotropic character of the etching (enlarged 520 times). The small fragments of glass fiber which were previously embedded in the TEFLON coating, fuctioning as etch masks, have protected the TEFLON beneath them and are shown being supported by straight-walled ridges of TEFLON.

FIGS. 1, 2, and 3 are scanning electron microscope photomicrographs depicting anisotropic etching of TFE TEFLON, a trademark of E.I. du Pont de Nemours & Co., in the high velocity oxygen atom beam at Los Alamos National Laboratory. A sample of Beta cloth, a TFE TEFLON coated, woven glass fabric used as a thermal control material in the U. S. Space Shuttle, was exposed to a fluence of high velocity (2.3 E21) oxygen atoms. The beam source gas was a mixture of equal volumes of oxygen and argon. The nominal atom kinetic energy was 2.0 eV and the vacuum ultraviolet intensity at the target was about 2 microwatts per square centimeter.

There are a variety of approaches to produce beams of neutral, ground state atomic oxygen of suitable beam energy and intensity absent the above stated damaging species. These may be divided into two main categories: high flux devices such as laser-generating plasma sources and low flux devices such as microwave and electron bombardment sources.

Among low flux devices are plasma techniques produced by electric fields having a range of frequencies from constant (dc arcs), <1 KHZ (ac arcs), 20 to 50 MHz (inductive coupling), and 2.5 GHz (microwaves). These sources require some physical device to support the plasma. Direct current arcs require electrodes, rf plasmas require an induction coil, and microwaves require a resonator or wave guide. Because rf and microwave source heating occurs by direct plasma-electric field interactions characterized by large absorption coefficients with the outer layers of the plasma, these modes of plasma production are characterized by low power density ($<200$ W/cm$^3$) and mode temperatures ($<8000°$ K. except for dc arcs—20,000° K.). Power inputs ranging from 15 KW for dc arcs to 100s of watts for rf and microwave sources are required.

Plasma torches form plasmas in helium by a sustained dc arc discharge. A small amount of $O_2$ is injected downstream of the arc into the gas flow where it is thermally dissociated into oxygen atoms by the hot helium. The high temperature, followed by isentropic expansion through a nozzle, produces oxygen atoms in the range of 1.0 to 2.0 eV at intensities of $10^{18}$–$10^{19}$ atoms/S-sr. Effusive sources, such as microwave discharges operated at low pressures, hot furnaces and conventional plasma ashers where material samples are exposed outside the plasma glow, produce O-atom beams of low energy and low intensity. The performance of these systems can be improved, however, by allowing the oxygen atoms generated by the discharge to expand through a supersonic nozzle, or by seeding and heating the oxygen plasma with argon or helium to increase the kinetic energy of the oxygen atoms.

Disassociative ionization of molecular oxygen to produce atomic oxygen may be accomplished by electron bombardment using commercially-available ion sources. This process is described by the following generic equations:

$$O_2 + e^- \rightarrow O + O^+ + 2e^-$$

$$O_2 + e^- \rightarrow O_2^+ + 2e^-$$

From the plasma are extracted ion beams of $O^+$ and $O_2^+$ which are then accelerated and mass selected by crossed electric and magnetic fields. The selected beam is then deaccelerated to the appropriate energy and neutralized by various means, such as electron transfer from flat metal surfaces (grazing incidence neutralization), resonate charge exchange with oxygen atoms produced by a secondary source such as decomposition of heated metal oxides, electron seeding, or resonate charge exchange with gaseous nitrogen or water vapor. Charge exchange methods excel at energies $>100$ eV but suffer from space charge limitations below 10 eV, however, producing beam intensities orders of magnitude less than other techniques.

Another method for producing fast neutral beams of state atomic oxygen is production of $O^-$ ions by resonance dissociative electron attachment in nitrous oxide ($N_2O$) followed by photo detachment to neutralize the $O^-$ ions. The process of resonance dissociative electron attachment may be described as follows:

$$e^- + N_2O \rightarrow N_2O^-$$

$$N_2O^- \rightarrow N_2 + O^-$$

The attractive higher attachment cross section, coupled with the fact that $N_2O$ does not affect indirectly heated cathodes or ion gun filaments as severely as $O_2$ makes $N_2O$ a good gas for $O^-$ production. Neutralization of the $O^-$ beam may be accomplished by photo detachment within the resonant cavity of continuous wave (cw) dye or argon ion lasers, or by a system of mirrors which cause the laser beam to transverse and interact a number of times with the ion beam. Neutral atoms produced in this way cannot be focused or collimated after they exit the neutralizer, and the flux at the time-target position will depend on the efficiency of the photo detachment process since ions not suffering photo detachment are removed from the neutral beam by a magnetic field and are collected by an ion detector.

Methods which produce high-intensity beams are generally of two types, pulsed and continuous wave. The pulsed systems consist of laser-induced breakdown of molecular oxygen which is introduced into an evacuated supersonic expansion nozzle through a pulsed molecular beam valve, and laser driven evaporator of cryogenically-frozen ozone/oxygen films and thin films of indium-tin oxide (ITO) applied to transparent substrates. The basic concept of laser-induced breakdown is to rapidly introduce a burst of gas into an evacuated nozzle and then focus the output of a pulsed laser to cause a breakdown at the nozzle throat. A high temperature plasma is produced by a laser-initiated detonation wave which then expands through a nozzle specifically designed to allow electron-ion recombination but not atomic recombination. As the high temperature gas expands through the nozzle, its directed velocity increases and a thermally "cold" high energy beam of oxygen atoms is produced at the nozzle exit.

Laser-driven evaporation uses a technique known as laser blow-off to produce pulsed beams of atomic oxygen. A thin coating of cryogenic ozone or ITO is irradiated by a high-energy, pulsed laser directed at the target film from the substrate side. The ITO film or frozen ozone is vaporized in vacuum and an intense pulse of energetic atomic and molecular oxygen (together with metal atoms when ITO films are used) is produced. A chopper is used to separate molecular oxygen and metal atoms from atomic oxygen within the beam since their velocities are considerably less than that of atomic oxygen. Neutral beams made in this way contain very few ions since the ion content of beams produced from rear surface irradiated films is greatly reduced compared to beams produced by front surface laser evaporation techniques.

The continuous wave sources produce high intensity atomic oxygen through the use of laser sustained Continuous Optical Discharge (COD). This technique uses commercially available high power laser technology to produce a high temperature (30,000° K.) oxygen-helium plasma which is positioned within the orifice of an expansion nozzle. To sustain the plasma, energy from a $CO_2$ cw laser is concentrated within a small focal volume using a ZnSe meniscus AR coated lens.

The high temperature produced by the plasma causes oxygen molecules introduced upstream of the nozzle to dissociate in oxygen atoms. High translational energies (5 eV) are produced as the O atoms undergo isentropic expansion through the nozzle. A skimmer located in-line with the nozzle is used to collimate the beam and prevent shock waves from limiting the velocity of the oxygen atoms.

Because the focused power of the cw laser is in the range of $10^6$ to $10^7$ W/cm$^2$, several orders of magnitude smaller than the typical breakdown thresholds of inert gases, a high energy external spark produced by a pulsed $CO_2$ laser is used to initiate the discharge. The primary advantages of using this technique to create energetic oxygen beams are the high temperatures produced by the high power densities ($10^4$ W/cm$^3$), the ability to sustain the discharge independent of nozzle material and without the need for elaborate cooling methods, and low total input power. Especially preferred, COD technique produces beams of high intensity ($10^{19}$ atoms/sec-sr) and high (2-5 eV) translational energy. Further information concerning sources of neutral atomic oxygen beams may be found in *NASA Technical Memorandum* 100459 *Vol. III* dated September 1988 which is hereby incorporated herein by reference. Additional details regarding continuous optical discharge devices may be found in U.S. Pat. No. 4,780,608 to Cross et al. as mentioned previously.

An additional preferred source of hyperthermal AO is LEO as previously mentioned. Manufacturing processes may take advantage of this ubiquitous environment for hyperthermal AO etching aboard orbiting spacecraft.

Several methods may be used to detect the etch products formed in stripping reactions. In one, reactor exhaust flows through a series of cold trays to isolate condensible products. In another, a mass spectrometer may be used to follow reaction extent. A further method of product detection involves the observation of characteristic visible and ultraviolet emission from a plasma. Optical emission spectroscopy (OES) has been used to identify etch products and to monitor the active species in a plasma without resist present. Products generally detected include $CO_2$, $H_2O$, CO, and $H_2$. Distinctive emission lines for oxygen atoms and ions also have been used to determine their relative abundance under various plasma conditions. OES is generally applicable and has broad applicability in process diagnostics and end-point detection. In the role of end-point detection, emission from a stripping product, generally CO, is monitored. As the resist or coating is etched from the surface the signal intensity decreases and eventually disappears when the coating is removed. This eliminates the need for close process monitoring and allows for batch to batch processing of coated substrates.

Multi-layer lithography is a specialized resist etch process with a more complicated mechanism. In general the motivation for using the more complicated system of multilayer lithography is to achieve higher resolution by smoothing underlying substrate topography. This is typically achieved by applying a relatively thick polymer film (on the order of 1 to 2 $\mu$m) to planarize existing topography. A separate resist is then coated directly on top of this layer for a bilayer application or on top of an additional etch barrier for trilayer lithography. The plasma is used for pattern transfer, where the goal is to replicate a lithographic image into the underlying planarizing layer. Of particular interest are processes which employ silicon-containing resists as the imaging layer above a hydrocarbon-based planarizing layer. Upon plasma exposure, the silicon near the resist surface is converted to an oxidized species which is etch resistant and serves as an in situ mask for pattern transfer into the planarizing layer. The utility of this approach depends on the resolution of the imaging layer. One of the more important benefits is that optical exposure with a shallower depth focus is permitted; this is an initial requirement for the deep-and mid-UV lenses currently used or in development.

There are several different approaches to multilayer lithography. These multilayer schemes can be grouped into two classifications, distinguished by the method used to transfer the pattern produced in the top resist into the planarizing layer. A first group of techniques makes use of portable conformable masks, which provides a contact mask for optical flood exposure of the planarizing layer, or contrast enhancement layers, which selectively bleach to increase the contrast of the aerial image during exposure. Another group of techniques use the upper layer(s) in the resist structure as an etch mask rather than an exposure mask.

An alternative approach to generating a resist which can also serve as an etch mask relies on gas-phase functionalization. In this method, the resist is exposed but is not immediately developed. Instead of using the exposure chemistry to achieve different solubilities for developing a relief image, this technique relies upon different reactivities between the exposed and unexposed regions. After exposure, a gaseous reagent such as hexamethyldisilazane (HMDS) selectively reacts with the exposed area. At this point, the film may be etched in hyperthermal AO plasma and functions similarly to a bilayer resist. By adjusting either the exposure or the gas-phase reaction, it is possible to control the depth and extent to which silylation occurs. In this scheme, only one resist layer is needed, and only the near-surface region needs be rendered etch resistant to serve as a pattern transfer mask. Approaches like this are referred to as "single layer" dry development resist materials. Further details of the various common approaches to multilayer semiconductor lithography may be found in M. A. Hartney et al., "Critical Review: Oxygen Plasma Etching for Resist Stripping and Multilayer Lithoghaphy," *Journal of Vacuum Science Technology*, B7 (1), Jan./Feb. 1989, which is hereby incorporated herein by reference.

When it is desired to anisotropically etch a silicon wafer substrate planarized by an oxygen labile polymer coating having a pattern mask layer thereon in a microelectronic manufacturing process, hyperthermal AO beams generated from the continuous optical discharge laser apparatus, for example, may be used. Wafers etched in batches are exposed to normal incident AO beams greater than 1 eV at a suitable intensity. Gaseous byproducts may be continuously monitored by OES spectroscopy for CO signal intensity, for example. When the monitored signal fades, the etching is halted.

In the space manufacturing process, the substrates with coatings to be etched are typically mounted in an apertured chamber. During exposure, the environmental oxygen atoms impinge a ram surface for a specified period of time. The aperture typically may be a computer controlled shutter device, where the exposure time may be either based on a known etching rate or dependent on analysis of the resulting collided atoms and by-products. Generally, analysis is by mass spectrometry for both time-of-flight data and reaction by-products.

The method of the present invention is further illustrated by the examples as follows.

EXAMPLE 1

Polymer samples were bombarded with both hyperthermal and thermal AO beams to estimate the effect of translational energy combined in an O-atom on etch anisotropy and reaction rate. Polymers tested comprised KAPTON, polyethylene, and deuterated polyethylene films. The hyperthermal AO source ($^3P$ O ground state atomic oxygen) was a continuous optical discharge device described in Cross et al. and the thermal AO source was a flowing afterglow apparatus known in the art.

Polymer samples were inserted at a 45° angle into the AO beam, which originated 1.25 meters away in a laser-sustained plasma source. The ion source of a quadrupole residual gas analyzer was placed 1 cm from the polymer surface on a line perpendicular to the same surface. The sample was first inserted into the beam, then retracted, and then a bare aluminum surface was inserted into the beam in order to distinguish background surface reactions from the polymer surface reactions. With the sample retracted out of the AO beam the mass spectrometer ion source was rotated into the direct beam to perform quantitative beam composition measurements as well as time-of-flight analysis to determine beam velocity. The high thermal mass of the manipulator did not allow heating or cooling of the sample. The samples' surface temperature remained in the range of 25°–50° C. during intermittent exposure (10 minutes) to the AO source, even though the sample was irradiated by the source at a power density of 1 watt/cm$^2$ (approximately 7 suns in the IR). In addition to the IR radiation emitted by the source, a level of approximately 1–3 suns at the top of Earth's atmosphere in the 1000–2000 Å (VUV) range bombarded the sample simultaneously with the atomic oxygen. The VUV radiation was mostly a continuum as opposed to the strong Lymann-Alpha line of 1216 Å, which is found in low Earth orbit.

Exposure to thermal (<0.05 eV) AO was performed in a flowing afterglow apparatus at flux levels $10^1$–$10^2$ greater than those employed in the hyperthermal beam apparatus.

The peak velocities obtained from experimental time-of-flight analysis data for mixtures of 10% $O_2$ in argon and 10% $O_2$ in neon represented translational energies of 1.5 eV and 2.9 eV, respectively, with approximately a full width at half maximum (FWHM) spread of 1 eV. AO intensities of $1.1 \times 10^{15}$/cm$^2$-sec and $2.4 \times 10^{15}$/cm$^2$-sec were observed under these conditions at the point of sample exposure approximately 125 cm from the beam source. The ion currents were not corrected for differences in ionization cross section or mass sensitive transmission effects in the quadrupole residual gas analyzer (RGA), nor were the experimental flight times corrected for photocell timing mark offset or ion flight times in the RGA.

Fractional dissociation of $O_2$ into AO was 90% for the $O_2$/argon mixture and 95% for the O/Ne mixture. The concentration of electronically excited O $^1D$, which may be present was not measured, but an upper limit was estimated from known quenching rates and the operational conditions of the source and comprised <4 percent of the source concentration in the Argon carrier gas and <10 percent for Neon carrier gas.

As-received KAPTON film was examined by SEM at about 10,000× magnification before and after exposure to either thermal or hyperthermal AO. The KAPTON exhibited some surface contamination as well as possible small bubbles beneath the surface. The KAPTON surface after having been exposed to thermal AO in the flowing after-glow apparatus for 86 hours or a total AO fluence of $4.2 \times 10^{24}$/cm$^2$ showed that the amount of surface contamination has not changed to any extent while the surface bubbles appear to have had their tops removed. It should be noted that the surface was still relatively smooth, being quite similar to the original as received condition. The SEM photograph of the hyperthermal AO exposed sample showed the KAPTON surface from a viewing angle of 90° from the surface, i.e., observing perpendicular to surface, after having been exposed to a 2.9 eV AO beam striking the surface at a 45° angle for a total fluence of $10^{20}$ AO/cm$^2$. The columnar formation (carpet) pointed in the direction of the AO beam not in the direction of the surface normal and the reactivity of KAPTON under this hyperthermal condition was approximately $10^4$ that under thermal AO attack. The final surface condition did not look at all like the original as-received surface.

This type of surface feature was seen for KAPTON surfaces exposed to the low Earth orbit environment (see Example 3). Ground-based laboratory measurements of the thermal activation energy for KAPTON (0.4 eV) under hyperthermal AO bombardment conditions also agreed with orbit measurements. The flux dependance of the reaction rate was investigated and over the range of fluxes from $5 \times 10^{15}$ to $1 \times 10^{17}$ AO/s-cm$^2$ the reactivity did not change within the measurement error (15%). These results indicated that a drastic change in reaction mechanism took place when reactant translational energy was increased.

The primary gas phase reaction products produced from KAPTON by hyperthermal AO were masses 1, 2, 16, 17, 18, 28, 30 and 44. This mass combination was interpreted as being produced from the gas phase species $H_2$, $H_2O$, CO, and $CO_2$; i.e., masses 1 through 17 came from the dissociative ionization of $H_2O$. Mass 30 was due to either/or NO and $H_2CO$ (formaldehyde). The gas phase reaction products from regular polyethylene (nondeuterated) exposed under the same conditions as KAPTON were similar except for small peaks at masses 15, 36 and 38 and that compared to KAPTON, polyethylene produces relatively more $CO_2$, water, and hydrogen. The gas phase reaction products from deuterated polyethylene exposed under the same conditions as KAPTON and regular polyethylene and showed the presence of deuterated reaction products masses 3, 5 and 19, which were interpreted as originating from HD, $D_2$ and HDO. The relative intensities of CO, $CO_2$, and water were more similar to regular polyethylene than to KAPTON.

The gas phase reaction products that were observed desorbing from ambient temperature polymer surfaces were oxides of hydrogen and carbon as well as hydrogen itself. Indeed, for reaction with deuterated polyethylene, HD and $D_2$ were observed. There were very small signals at mass 15 ($CH_4$) and 30 ($H_2CO$, NO) with KAPTON and polyethylene polymers, but no cracking fingerprints for alcohols or aldehydes. These results leave open the question of whether hyperthermal AO directly abstracted both 1) carbon, forming CO and $CO_2$ and/or 2) hydrogen, forming OH and $H_2O$ from the polymer structure, or whether lower molecular weight intermediates were formed, which subsequently reacted with AO through abstraction and insertion.

Survey x-ray photoelectron spectroscopy (XPS) spectra of the as-received and hyperthermal AO exposed samples of KAPTON were obtained using MgK radiation and a hemispherical analyzer with a 89.45-eV pass energy. The exposed sample was removed from the exposure facility and transferred in air before the spectra were taken. Analysis of the spectra showed that there was a 65% increase in the surface oxygen, that the nitrogen was not changed appreciably, and that carbon has decreased by 17%. The carbon 1S spectra of as-received and exposed KAPTON showed the various binding states of carbon present in the measured spectrum arising from CH species, from C—O or CN and from C=O. These results implied that either the oxygen was attached to the aromatic carbon forming quinone type structure and/or had broken the benzene ring and inserted, forming a double bond structure. In any case, these structures were precursors to the formation of low molecular weight gas phase products through reaction with either surface-absorbed free radicals or hyperthermal AO.

The reactivity of KAPTON with atomic oxygen under various exposure conditions was plotted versus relative translational energy and found to be relatively insensitive to translational energy above 1 eV. An Arrhenius-like expression having an activation barrier of 0.4 eV was fitted to the data, which suggested that there was a rate limiting step in the AO/KAPTON reaction mechanism, which could be overcome by translational energy. Approximately 10% of the AO reacted to form volatile products at high collision energy while the remaining 90% desorbed from the surface with a translational temperature roughly equal to the polymer surface temperature.

EXAMPLE 2

To demonstrate a semiconductor manufacturing process utilizing hyperthermal AO, a semiconductor wafer having an inner NOVOLAC planarizing layer, a polysiloxane electron-beam (EB) resist outer layer and a mask overlay of a pattern to be etched, is exposed to EB radiation to imprint the pattern into the resist layer. EB radiation selectively crosslinks the EB resist thereby making the crosslinked regions resistant to a developing solvent. Developing the outer resist forms an oxygen resistant mask of the pattern to be transferred to the oxygen labile planarizing layer. Hyperthermal atomic oxygen ($^3P$ O) is utilized to etch the planarizing layer anisotropically without damaging the underlying substrate. The source for hyperthermal AO is a Cross apparatus as described in Example 1 and U.S. Pat. No. 4,780,608 except that the substrate is exposed to the surface normal AO bombardment (rather than 45° incident beams) and energy level is analyzed to be 1.5 eV for the $O_2$/argon mixture. Process conditions are similar to Example 1 for 1.5 eV AO in argon. Etch exposure is continuous until completion with reaction products analyzed from evacuated chamber gases by optical emission spectroscopy (OES). When a CO reaction product signal fades, etching is complete. SEM and reliability analysis of a completed circuit indicates that a high aspect ratio anisotropic etch is achieved without underlying substrate damage and contamination.

EXAMPLE 3

Several different polymer film samples were exposed to low Earth orbit (LEO) environment to determine the effect of high kinetic energy AO impingement relative to spacecraft surfaces. Samples were mounted in the cargo chamber of the space shuttle Challenger and exposed normal to surface for about 41.75 hours with a calculated AO fluence of $3.5 \times 10^{20}$ atoms/cm$^2$. Upon completion of the flight, surface recession was measured primarily by mass change. Other parameters such as temperature and solar radiation were assessed as was the importance of atmospheric ionic species on surface recession.

Polymeric films tested included 2.5 cm disks and strips of KAPTON, MYLAR, TEFLON TFE and FEP, TEDLAR, polyethylene, polyester, polyimide, polysiloxane/polyimide copolymer, polymethyl methacrylate, polybenzimidazole, polystyrene and polysulfone. Further details regarding sample layout and other individual procedures may be found in Visentine et al., NASA Technical Memorandum 100459, Vol. I, pp 2½-10, September, 1988 which is hereby incorporated herein by reference. Surface recession results for selected film samples appear in Table I. Temperature dependence at least up to 121° C. appears not to be a factor. Those samples without temperature control were at space ambient temperature estimated to be about $-15°$ C. Reaction rate was calculated based on a surface recession rate corrected for non-normal impingement and total fluence (equal to incident flux times exposure time).

Besides surface recession, surface morphology was altered to incorporate carpet-like formations. SEM photographs before and after exposure of a 25.4 μm KAPTON film (10,000 magnification) clearly showed the previous featureless surface with spike-like formations.

TABLE 1

| MATERIAL | Thickness μm (mils) | Surface Recession $^a$(μm) Strip Samples 121° C. | Surface Recession $^a$(μm) Strip Samples 65° C. | Disc Samples | Average$^b$ | Reaction Efficiency cm$^3$/atom × 10$^{-24}$ |
|---|---|---|---|---|---|---|
| Kapton | 12.7 (0.5) | 9.5 | 10.5 | 11.1 | | |
| | | 11.8 | 10.3 | | | |
| Kapton | 25.4 (1.0) | 9.8 | 10.7 | | | |
| | | 9.9 | 9.0 | | 10.5 | 3.0 |
| Kapton | 50.8 (2.0) | 11.1 | 10.6 | | | |
| | | 11.1 | 11.1 | | | |
| Mylar A | 12.7 (0.5) | 12.7 | 12.3 | 12.7 | 12.6 | 3.6 |
| Mylar A | 40.6 (1.6) | 12.1 | 11.9 | | 12.0 | 3.4 |
| Mylar D | 50.8 (2.0) | 9.9 | 10.2 | | 10.4 | 3.0 |
| | | 11.0 | 10.4 | | | |
| Clear Tedlar | 12.7 (0.5) | 10.9 | 11.5 | | 11.2 | 3.2 |
| Polyethylene | 20.3 (0.8) | | | 11.5 | 11.5 | 3.3 |
| Teflon TFE | 12.7 (0.5) | | | <0.2 | <0.2 | <0.05 |
| Kapton F | 30.5 (1.2) | <0.2 | <02. | <02. | <0.2 | <0.05 |

$^a$Corrected for non-normal impingement.
$^b$Strip and disc samples.

EXAMPLE 4

In a reaction chamber having a controlled shuttered aperture, a silicon wafer having a lithographic circuit pattern masked as in Example 2 is mounted and anisotropically etched by bombardment of normal to surface ambient AO in LEO. AO flux concentration and kinetic energy is similar to Example 3 and exposure time is controlled by OES analysis of evacuated chamber reaction product gases similar to Example 2. Upon completion of etching, the shutter aperture is closed. The wafer is etched anisotropically without substrate damage and surface contamination.

The foregoing description of the invention is illustrative and explanatory thereof. Various changes in the materials, apparatus, and particular parts employed will occur to those skilled in the art. It is intended that all such variations within the scope and spirit of the appended claims be embraced thereby.

What is claimed is:

1. A method for anisotropic etching a hydrocarbon polymer coating in the manufacture of semiconductor wafers, comprising the steps of:
   (a) producing a beam of hyperthermal atomic oxygen using a continuous optical discharge laser;
   (b) exposing said semiconductor wafers having a surface comprising said coating to said beam of hyperthermal atomic oxygen to anisotropically etch said coating and produce a desired pattern on said semiconductor wafer; and
   (c) halting said hyperthermal atomic oxygen exposure after said coating is etched.

2. The method of claim 1, wherein said hydrocarbon polymer coating further comprises silicon.

3. The method of claim 1, wherein said kinetic energy of said atomic oxygen is in the range between about 0.2 eV to 20 eV.

4. The method of claim 1, wherein said kinetic energy of said atomic oxygen is in the range between about 1 eV to 10 eV.

5. The method of producing an anisotropically etched semiconductor device comprising the steps:
   (a) producing a beam of hyperthermal atomic oxygen;
   (b) exposing a silicon wafer substrate planarized by an oxygen labile polymer coating having a mask pattern thereon to said beam of hyperthermal atomic oxygen and producing thereby gaseous byproducts;
   (c) monitoring gaseous byproducts of such exposure; and
   (d) halting said hyperthermal atomic oxygen exposure after sufficient reduction of monitored signal.

6. The method of claim 5 wherein said step of monitoring gaseous byproducts includes monitoring the CO signal intensity of said byproducts.

7. The method of claim 6 wherein said step of monitoring the CO signal intensity includes monitoring the CO signal intensity using optical emission spectroscopy.

8. The method of claim 5 wherein said step of producing a beam of hyperthermal atomic oxygen includes generating the beam using a continuous optical discharge laser.

9. The method of claim 5 wherein said step of producing a beam of hyperthermal atomic oxygen includes producing a beam of atomic oxygen wherein the oxygen atoms have a kinetic energy in the range of 0.2 eV to 20 eV.

10. The method of claim 5 wherein said step of producing a beam of hyperthermal atomic oxygen includes producing a beam of atomic oxygen wherein the oxygen atoms have a kinetic energy in the range of 1 eV to 10 eV.

11. The method of producing an anisotropically etched semiconductor device comprising the steps:
   (a) exposing to electron beam radiation a semiconductor wafer having an inner planarized layer, a polysiloxane outer resist layer and a mask overlay of a pattern to be etched to imprint the pattern into the resist layer;
   (b) developing the outer resist using a developing solvent to form an oxygen resistant mask of the pattern; and
   (c) producing a beam of hyperthermal atomic oxygen;
   (d) exposing the outer resist layer to said beam of hyperthermal atomic oxygen to etch the planarized layer anisotropically.

12. The method of claim 11 wherein said step of producing a beam of hyperthermal atomic oxygen includes generating the beam using a continuous optical discharge laser.

13. The method of claim 11 wherein said step of producing a beam of hyperthermal atomic oxygen includes producing a beam of atomic oxygen wherein the oxygen atoms have a kinetic energy in the range of 0.2 eV to 20 eV.

14. The method of claim 11 wherein said step of producing a beam of hyperthermal atomic oxygen includes producing a beam of atomic oxygen wherein the oxygen atoms have a kinetic energy in the range of 1 eV to 10 eV.

* * * * *